(12) United States Patent
Moon

(10) Patent No.: US 7,169,658 B2
(45) Date of Patent: Jan. 30, 2007

(54) METHOD FOR FORMATION OF AN ULTRA-THIN FILM AND SEMICONDUCTOR DEVICE CONTAINING SUCH A FILM

(75) Inventor: Bum-Ki Moon, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 184 days.

(21) Appl. No.: 10/767,928

(22) Filed: Jan. 29, 2004

(65) Prior Publication Data
US 2005/0170531 A1    Aug. 4, 2005

(51) Int. Cl.
*H01L 21/336* (2006.01)
(52) U.S. Cl. .......... 438/197; 438/3; 438/240; 438/199; 438/287; 257/E21.011
(58) Field of Classification Search .......... 438/3, 438/240, 197, 199, 287
See application file for complete search history.

(56) References Cited

U.S. PATENT DOCUMENTS

| 5,572,052 A | * | 11/1996 | Kashihara et al. | .......... 257/295 |
| 6,674,109 B1 | * | 1/2004 | Fujimori et al. | ............ 257/295 |
| 2002/0123158 A1 | * | 9/2002 | Murai | ............................ 438/3 |
| 2003/0054572 A1 | * | 3/2003 | Fujimori | ........................ 438/3 |

FOREIGN PATENT DOCUMENTS

EP            821415 A2  *  1/1998

* cited by examiner

*Primary Examiner*—Michael Lebentritt
*Assistant Examiner*—Kyoung Lee
(74) *Attorney, Agent, or Firm*—Slater & Matsil, L.L.P.

(57) ABSTRACT

A method of manufacturing an ultra-thin PZT pyrochlore film comprises providing a structure comprising a base layer, and forming on the base layer, a titanium layer and a PZT layer in mutual contact. The structure is annealed to form a PZT pyrochlore layer on said base layer. Novel devices with an ultra-thin PZT layer may thereby be manufactured.

4 Claims, 1 Drawing Sheet

METHOD FOR FORMATION OF AN ULTRA-THIN FILM AND SEMICONDUCTOR DEVICE CONTAINING SUCH A FILM

FIELD OF THE INVENTION

The present invention relates to a method for the formation of a PZT pyrochlore ultra-thin film. Such a film can be thereby formed with a very smooth surface and excellent crystal grain uniformity, suitable for use as a dielectric material in a semiconductor device.

BACKGROUND OF THE INVENTION

Conventional thin dielectric materials for use in capacitors or as a gate insulation layer in an FET structure are, for example, $Ta_2O_5$, $Al_2O_3$, $CeO_2$ and SiON. A typical dielectric constant for an $Al_2O_3$ film is in the range of from 10 to 15.

Pb (Zr, Ti)$O_3$ (PZT) is a well-known material which may find a number of different applications in the manufacture of semiconductor devices, for example as a ferroelectric material. PZT may be formed having a pyrochlore phase therein. Such a material is hereinafter referred to as "PZT pyrochlore". In this way, films with very high dielectric constants, for example from 40 up to 100 may be provided. If a PZT pyrochlore film could be manufactured which is extremely thin, having a very smooth surface and an excellent grain uniformity then there would be clear advantages in the possibility of manufacturing high quality VLSI/ULSI devices such as capacitors, FETs and the like, having high integration density and good reliability.

Definition of the Invention

A first aspect of the present invention comprises a method of manufacturing an ultra-thin PZT pyrochlore film, the method comprising providing a structure comprising a base layer, and forming on said base layer, a titanium layer and a PZT layer in mutual contact, annealing said structure thereby forming said PZT pyrochlore layer on said base layer. Preferably, the titanium layer comprises elemental titanium or titanium oxide (TiO$_x$).

In the method of the present invention, preferably the titanium layer is first formed above a substrate or wafer and the PZT layer is subsequently formed on top, prior to annealing. However, the reverse situation (deposition of PZT before the Ti layer) is also within the ambit of the present invention.

Optimally, for good smoothness, the ratio of the thickness of the titanium layer to that of the PZT layer, is 1:3 or more, preferably 1:2 or more, still more preferably, 1:1 or more, for example up to 1:0.1.

Typical annealing temperatures are from 400° C. to 800° C., preferably from 550° C. to 750° C.

Deposition of the layers to be annealed can be effected by conventional methods such as physical vapour deposition (PVD) or chemical vapour deposition (CVD) or spin coating. The annealing method may also be effected by conventional means, for example use of rapid thermal annealing (RTA) or in a furnace. The annealing can be carried out in many suitable atmospheres such as oxygen, air or nitrous oxide.

Preferably the Ti and PZT layers are formed on a metal layer such as Pt, Au or W.

In practice, the method of the present invention may be used to manufacture a wide range of electronic devices, for example capacitors or active devices such as various kinds of FET.

Another aspect of the present invention therefore provides a method of manufacturing a capacitor, the method comprising forming a lower electrode layer, forming in mutual contact, a titanium layer and a PZT layer, performing an annealing step so that a PZT pyrochlore dielectric layer is formed from said titanium layer and said. PZT layer and forming an upper electrode layer above the PZT pyrochlore dielectric layer. Preferably, the titanium layer comprises elemental titanium or titanium oxide (TiO$_x$). Another aspect of the present invention provides a method of manufacturing a field effect transistor, the method comprising forming a drain region and a source region separated by a gate region, forming a titanium layer and a PZT layer in mutual contact and at least partially overlying said gate region, performing an annealing step so that a PZT pyrochlore insulating layer is formed from said titanium layer and said PZT layer and forming a gate electrode above said PZT pyrochlore insulating layer.

Electronic devices with ultra-thin pyrochlore layers are also in themselves novel. Therefore, a further aspect of the present invention provides an electronic device comprising a PZT pyrochlore layer of no more than 20 nm thickness, preferably no more than 10 nm thickness.

The present invention will now be explained in more detail by the following description of preferred embodiments, and with reference to the accompanying drawings in which.

DETAILED DESCRIPTION OF THE PREFERRED EMBODIMENTS

Figure 1A:
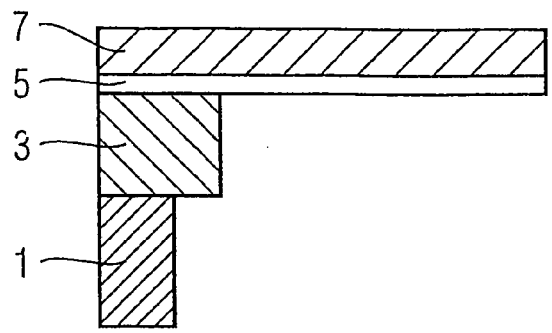
FIG. 1A shows a structure for effecting the method of the present invention.

Turning now to FIG. 1, there is shown in FIG. 1A, a structure for effecting an initial step of the process according to the present invention.

As depicted in FIG. 1A, on a silicon substrate 1, is formed a metal layer 3 such as of platinum.

On the metalised layer 3, is formed a titanium layer by PVD and then by CVD on top of the titanium layer 5, a PZT layer 7 is formed.

Preferably, the titanium layer comprises elemental titanium or titanium oxide (TiO$_x$). Elemental titanium refers to titanium that is not combined to form part of a compound.

In this example, the wafer is annealed at 650° C. for 30 seconds in oxygen ambient.

Figure 1B:
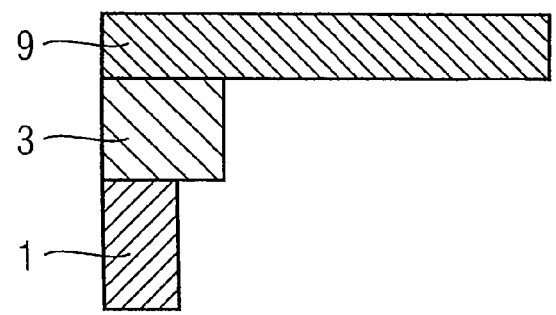
FIG. 1B shows the structure of the device structure resulting from application of the method of the present invention to the structure shown in FIG. 1A.

As a result of the annealing process, as shown in FIG. 1B, the titanium layer 5 and the PZT layer 7 form an ultra-thin PZT pyrochlore layer 9.

Tests were performed to produce a PZT layer with a pyrochlore phase according to the aforementioned method, using a 2.5 nm elemental titanium layer and a 7.5 nm PZT layer on a platinum layer 5. In experimental TEM measurements, in cross-section, a smooth morphology was found down to the nm scale and excellent small pyrochlore grains were observed. In order to confirm the nature of the pyrochlore phase, a nm beam diffraction method was used and the diffraction pattern showed a typical PZT pyrochlore crystal system.

In a further investigation, using 2.5 nm elemental titanium and 17.5 nm PZT, a mixed PZT/pyrochlore phase was found. Under these conditions, a rougher surface resulted because of PZT recrystallisation during annealing, resulting in formation of a PZT {110} crystal structure. From this, it was deduced that usually the ratio of titanium to PZT should not be less than 1:3.

Figure 2:
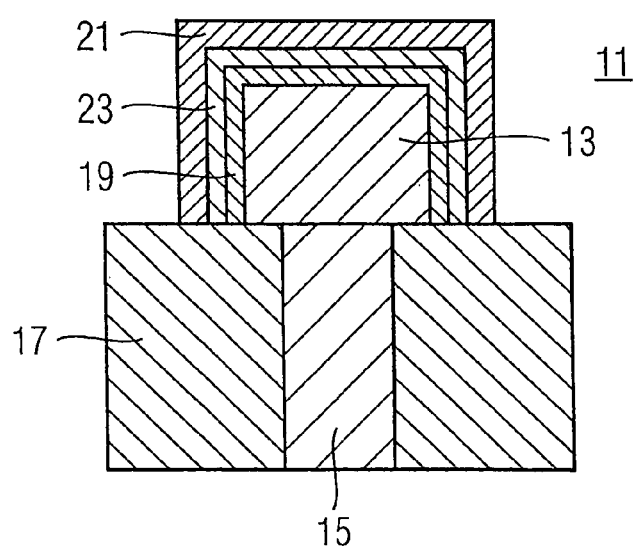
FIG. 2 shows one embodiment of a device resulting from utilisation of the method according to the present invention.

As shown in FIG. 2, a typical device which can be advantageously fabricated by this method is a stack 3-D capacitor.

As shown in FIG. 2, this capacitor 11 has a poly-silicon or metal (eg W) island or node 13 formed on a plug 15 in an interlayer dielectric film 17. After etching an isolation, a lower platinum layer 19 is formed over the node 13, followed by titanium and then PZT in thicknesses similar to those mentioned with regard to embodiment of FIGS. 1A and 1B. Then, after annealing under similar conditions as before, the titanium and PZT layers fuse to form a PZT film with pyrochlore phase 23 of very low thickness. Finally, an upper platinum layer 21 is deposited.

In the light of this description, modifications of these described embodiments as well as other embodiments fall within the spirit and scope of the present invention.

The invention claimed is:

1. A method of manufacturing a field effect transistor, the method comprising forming a drain region and a source region separated by a gate region, forming a titanium layer and a PZT layer in mutual contact and at least partially overlying said gate region, performing an annealing step so that a PZT pyrochlore insulating layer is formed from said titanium layer and said PZT layer and forming a gate electrode above said PZT pyrochlore insulating layer, wherein said titanium layer comprises elemental titanium.

2. The method of claim 1, wherein said structure is annealed at a temperature of 550° C. to 750° C.

3. The method of claim 1, wherein the ratio of the thickness of said titanium layer to tat of said PZT layer is 1:3 or more.

4. The method of claim 1, wherein said structure is annealed at a temperature of 400 ° C. to 800° C.

* * * * *

UNITED STATES PATENT AND TRADEMARK OFFICE
CERTIFICATE OF CORRECTION

PATENT NO.        : 7,169,658 B2                                                                 Page 1 of 1
APPLICATION NO. : 10/767928
DATED             : January 30, 2007
INVENTOR(S)       : Moon It is certified that error appears in the above-identified patent and that said Letters Patent is hereby corrected as shown below:

Column 4, line 12; delete "550° C." insert--550°C--
Column 4, line 14; delete "tat" insert--that--
Column 4, line 17; delete "400° C." insert--400°C--

Signed and Sealed this

Tenth Day of April, 2007

JON W. DUDAS
*Director of the United States Patent and Trademark Office*